United States Patent
Chen et al.

(10) Patent No.: US 10,269,981 B2
(45) Date of Patent: Apr. 23, 2019

(54) MULTI-CHANNEL FIELD EFFECT TRANSISTORS USING 2D-MATERIAL

(71) Applicants: Taiwan Semiconductor Manufacturing Company, Ltd., Hsin-Chu (TW); National Taiwan University, Taipei (TW)

(72) Inventors: Pin-Shiang Chen, Taipei (TW); Hung-Chih Chang, Taichung (TW); Chee-Wee Liu, Taipei (TW); Samuel C. Pan, Hsin-Chu (TW)

(73) Assignees: Taiwan Semiconductor Manufacturing Company, Ltd., Hsin-Chu (TW); National Taiwan University, Taipei (TW)

( * ) Notice: Subject to any disclaimer, the term of this patent is extended or adjusted under 35 U.S.C. 154(b) by 1059 days.

(21) Appl. No.: 14/543,396

(22) Filed: Nov. 17, 2014

(65) Prior Publication Data
US 2016/0141427 A1    May 19, 2016

(51) Int. Cl.
*H01L 29/786* (2006.01)
*H01L 29/66* (2006.01)

(52) U.S. Cl.
CPC .. *H01L 29/78696* (2013.01); *H01L 29/66969* (2013.01); *H01L 29/78603* (2013.01); *H01L 29/78648* (2013.01); *H01L 29/78681* (2013.01)

(58) Field of Classification Search
None
See application file for complete search history.

(56) References Cited

U.S. PATENT DOCUMENTS

| | | | |
|---|---|---|---|
| 7,474,930 B2 | 1/2009 | Lapstun et al. | |
| 8,264,021 B2 | 9/2012 | Lai et al. | |
| 2013/0105824 A1 | 5/2013 | Paranjape et al. | |
| 2014/0131698 A1* | 5/2014 | Kim | H01L 29/78681 257/42 |
| 2014/0183453 A1* | 7/2014 | Kim | H01L 29/151 257/29 |
| 2015/0221499 A1* | 8/2015 | Park | H01L 29/1606 257/29 |

FOREIGN PATENT DOCUMENTS

JP    5595856    8/2014

OTHER PUBLICATIONS

Fang, H. et al., "High-Performance Single Layered WSe2 p-FETs with Chemically Doped Contacts," NANO Letters, pubs.acs.org/NanoLett, 12 (7), Jun. 2012; pp. 3788-3792.
Fang, H et al., "Degenerate n-Doping of Few-Layer Transition Metal Dichalcogenides by Potassium," NANO Letters, pubs.acs.org/NanoLett, vol. 13, Apr. 2013, pp. 1991-1995.

* cited by examiner

*Primary Examiner* — Michelle Mandala
(74) *Attorney, Agent, or Firm* — Slater Matsil, LLP (57) ABSTRACT

A device includes a semiconductor substrate, a buried oxide over the substrate, a first transition metal dichalcogenide layer over the buried oxide, an insulator over the first transition metal dichalcogenide layer, and a second transition metal dichalcogenide layer over the insulator. A gate dielectric is over the second transition metal dichalcogenide layer, and a gate is over the gate dielectric.

20 Claims, 13 Drawing Sheets

MULTI-CHANNEL FIELD EFFECT TRANSISTORS USING 2D-MATERIAL

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

In recent development of the FETs, Transition Metal Dichalcogenide (TMD) materials are used for forming the FETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 13A, 13B, 14A, and 14B illustrate the cross-sectional views of intermediate stages in the formation of a Field Effect Transistor (FET) incorporating Two-Dimension (2D) Transition Metal Dichalcogenides (TMD) in accordance with some embodiments;

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Field Effect Transistor (FET) incorporating Two-Dimension (2D) Transition Metal Dichalcogenide (TMD) and the method of forming the same are provided in accordance with various exemplary embodiments. The intermediate stages of forming the 2D TMD FET are illustrated. The variations of the embodiments are discussed. Throughout the various views and illustrative embodiments, like reference numbers are used to designate like elements.

Figure 17:
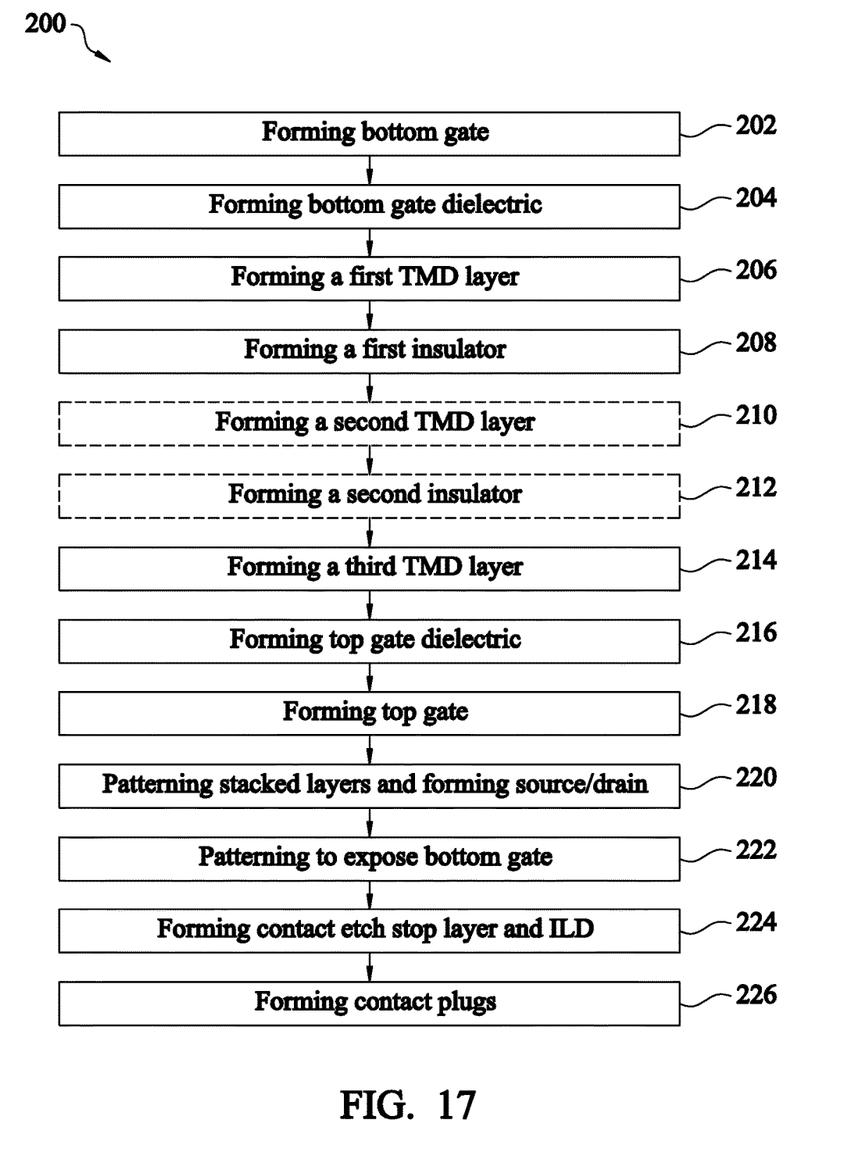
FIG. 17 illustrates a process flow for forming a 2D TMD FET in accordance with alternative embodiments.

FIGS. 1 through 13A, 13B, 14A, and 14B illustrate the cross-sectional views of intermediate stages in the formation of a 2D TMD FET in accordance with some embodiments. The steps shown in FIGS. 1 through 13A, 13B, 14A, and 14B are also illustrated schematically in the process flow 200 shown in FIG. 17. In the subsequent discussion, the process steps shown in FIGS. 1 through 13A, 13B, 14A, and 14B are discussed referring to the process steps in FIG. 17.

Figure 1:
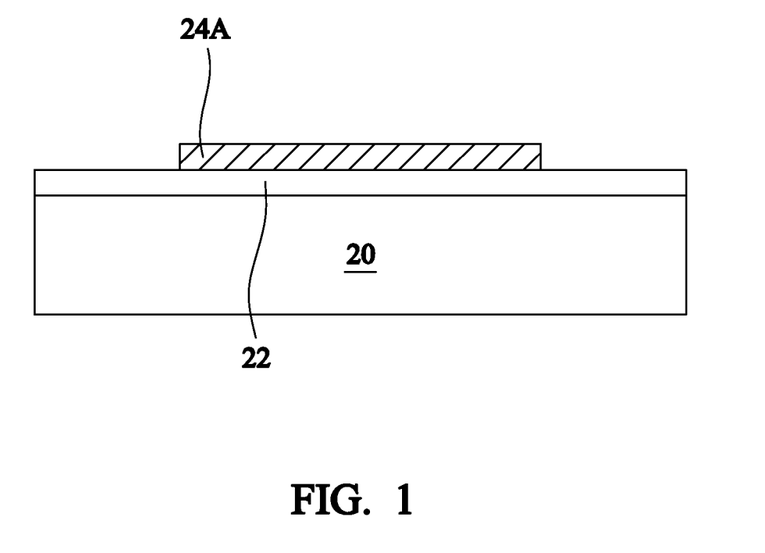

Referring first to FIG. 1, a portion of substrate 20 is shown having a first dielectric layer 22 formed thereon. Substrate 20 may be formed of silicon, although it may also be formed of other group IIIA, group IVA, and/or group VA elements such as germanium, gallium, arsenic, or combinations thereof. Substrate 20 may also be a Silicon-On-Insulator (SOI) substrate. In the embodiments in which substrate 20 has an SOI structure, substrate 20 comprises a layer of a semiconductor material (such as silicon, germanium and/or the like) formed on an insulator layer (not shown). The insulator layer may be, for example, a buried oxide (BOX) layer or a silicon oxide layer. The use of the semiconductor substrate makes the process for forming the 2D TMD FETs compatible with forming other Metal-Oxide-Semiconductor (MOS) transistors in the same chip. In accordance with alternative embodiments of the present disclosure, substrate 20 is a dielectric substrate such as a glass substrate, an aluminum oxide substrate, a silicon oxide substrate, or the like.

In the embodiments in which substrate 20 is a semiconductor substrate, insulation layer 22 is formed over substrate 20 to electrically insulate the overlying structure from substrate 20. In accordance with some embodiments of the present disclosure, insulation layer 22 is formed of a dielectric material, which is selected from materials including, and not limited to, an oxide such as silicon oxide, a nitride such as silicon nitride, an oxynitride such as silicon oxynitride, and a carbide such as silicon carbide. In these embodiments, insulation layer 22 forms an insulator (a buried oxide layer, for example) that is formed on a semiconductor (such as silicon) substrate. In the embodiments in which substrate 20 is a silicon substrate, insulation layer 22 may be formed through thermally oxidizing silicon substrate 20 to generate silicon oxide as a surface layer. In alternative embodiments, insulation layer 22 is formed using a deposition method such as Chemical Vapor Deposition (CVD), Plasma Enhance Chemical Vapor Deposition (PECVD), or the like.

Again referring to FIG. 1, conductive layer 24A is formed over insulation layer 22. The respective step is shown as step 202 in the process flow shown in FIG. 17. In accordance with some embodiments, conductive layer 24A comprises a metal such as nickel (Ni), palladium (Pd), scandium (Sc), titanium (Ti), or alloys thereof. In alternative embodiments, conductive layer 24A is formed using other conductive materials selected from, and not limited to, polysilicon, metal silicide, metal nitride, or the like. Conductive layer 24A may be formed using Physical Vapor Deposition (PVD), Atomic Layer Deposition (ALD), or other applicable materials. After the formation, conductive layer 24A is patterned, as shown in FIG. 1. Throughout the description, conductive layer 24A is also referred to as a bottom gate.

Figure 2:
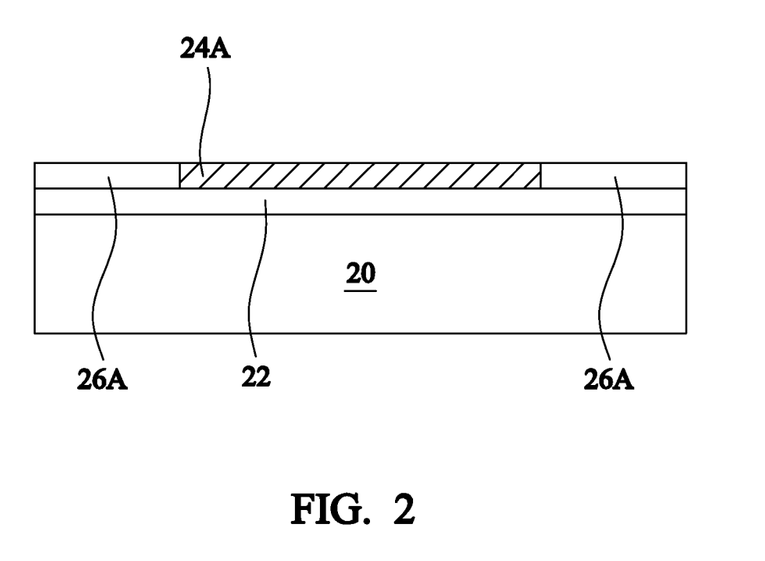

Next, referring to FIG. 2, dielectric layer 26A is formed on the opposite sides of bottom gate 24A. In accordance with some embodiments, when viewed in the top view, dielectric layer 26A may fully encircle bottom gate 24A. Dielectric layer 26A may also be formed of a dielectric material such as a nitride, an oxynitride, a carbide, or the like. The top surface of dielectric layer 26A is coplanar with the top surface of bottom gate 24A in some embodiments. The formation of dielectric layer 26A may include depositing a blanket dielectric layer using a CVD method, spin on, or the like, and then performing a Chemical Mechanical Polish (CMP) to level the top surface of bottom gate 24A with the top surface of dielectric layer 26A.

Figure 3:
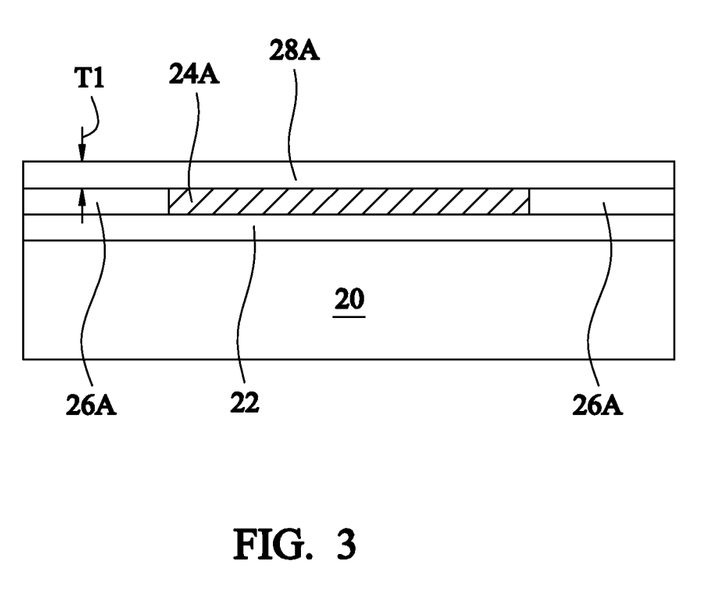

Next, referring to FIG. 3, gate dielectric 28A is formed over bottom gate 24A and dielectric layer 26A. The respective step is shown as step 204 in the process flow shown in FIG. 17. In accordance with some embodiments of the present disclosure, gate dielectric 28A comprises a high-k dielectric material selected from $HfO_2$, $HfSiO_x$, $HfZrO_x$, $Al_2O_3$, $TiO_2$, $LaO_x$, $BaSrTiO_x$ (BST), $PbZr_xTi_yO_z$ (PZT), multi-layers thereof, and/or combinations thereof. The formation method includes CVD, PECVD, ALD, and the like. In alternative embodiments, gate dielectric 28A is formed of other dielectric materials such as silicon oxide, silicon nitride, or the like. The Effective Oxide Thickness (EOT) of gate dielectric 28A is small, and may be smaller than about 2 nm or 1 nm in accordance with some embodiments. In some exemplary embodiments, the EOT of gate dielectric 28A is about 0.6 nm. The reduction of the EOT may be achieved by forming gate dielectric 28A as a high-k dielectric material, whose EOT is equal to the thickness T1 of gate dielectric 28A divided by the k value of gate dielectric 28A, and multiplied by the k value of silicon oxide (about 3.8). In some exemplary embodiments, thickness T1 is in the range between about 1 nm and about 15 nm.

Figure 4:
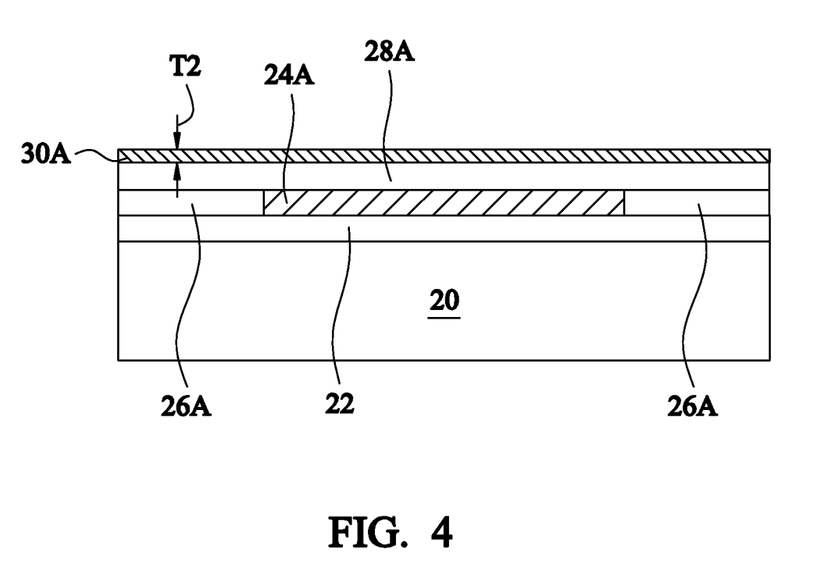

Referring to FIG. 4, TMD layer 30A is formed. The respective step is shown as step 206 in the process flow shown in FIG. 17. In accordance with some embodiments of the present disclosure, TMD layer 30A comprises the compound of a transition metal and a group VIA element. The transition metal may include tungsten (W), molybdenum (Mo), Ti, or the like. The group VIA element may be sulfur (S), selenium (Se), tellurium (Te), or the like. For example, TMD layer 30 may include $MoS_2$, $MoSe_2$, $WS_2$, $WSe_2$, or the like.

Figure 15:
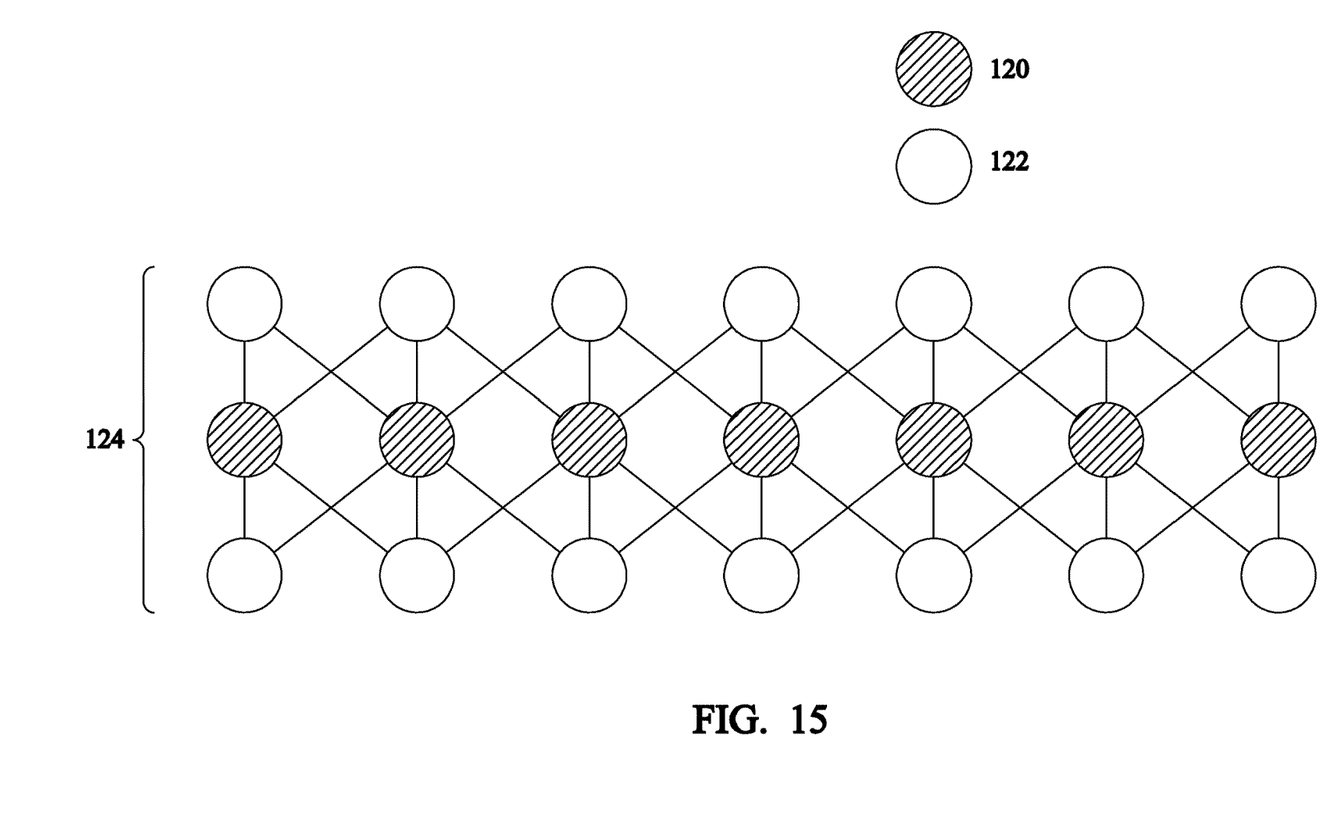
FIG. 15 illustrates a mono-layer of TMD in accordance with some embodiments.

TMD layer 30A may be a mono-layer or a few-layer. FIG. 15 illustrates a mono-layer of TDM in accordance with some exemplary embodiments. In FIG. 15, the transition metal atoms 120 form a layer in the middle, and the group VIA atoms 122 form a first layer over the layer of atoms 120, and a second layer underlying the layer of atoms 120. Atoms 120 may be W atoms, Mo atoms, or Ti atoms, and atoms 122 may be S atoms, Se atoms, or Te atoms. In the illustrated exemplary embodiments, each of atoms 120 is bonded to four atoms 122, and each of atoms 122 is bonded to two atoms 120. Throughout the description, the illustrated cross-bonded layers including one layer of atoms 120 and two layers of atoms 122 in combination are referred to as a mono-layer 124 of TMD.

Referring back to FIG. 4, in accordance with some embodiments of the present disclosure, TMD layer 30A has a crystalline structure with a single mono-layer 124 (FIG. 15). In accordance with alternative embodiments of the present disclosure, TMD layer 30A has several layers of mono-layer 124, and hence is referred to as having a few-layer structure. In the few-layer structure, there are several mono-layers 124 (FIG. 15) stacked. In accordance with some embodiments, the total count of mono-layer 124 in the few-layer is small in order to improve the gate control of the resulting 2D TMD FET, wherein the gate control reflects the ability of the gate(s) controlling the channel of the resulting FET. The total count of mono-layers 124 in the few-layer may be smaller than about 5 in some exemplary embodiments. In alternative embodiments, the total count may be greater than 5. Thickness T2 of TMD layer 30A may be in the range between about 0.5 nm and about 5 in some exemplary embodiments.

TMD layer 30A may be formed using CVD, with $MoO_3$ and S as process gases and $N_2$ as carrier gas. In alternative embodiments PECVD, or another applicable method is used. The formation temperature may be between about 600° C. and about 700° C. in some exemplary embodiments, and higher or lower temperatures may be used. The process conditions are controlled to achieve the desirable total count of mono-layers.

Figure 5:
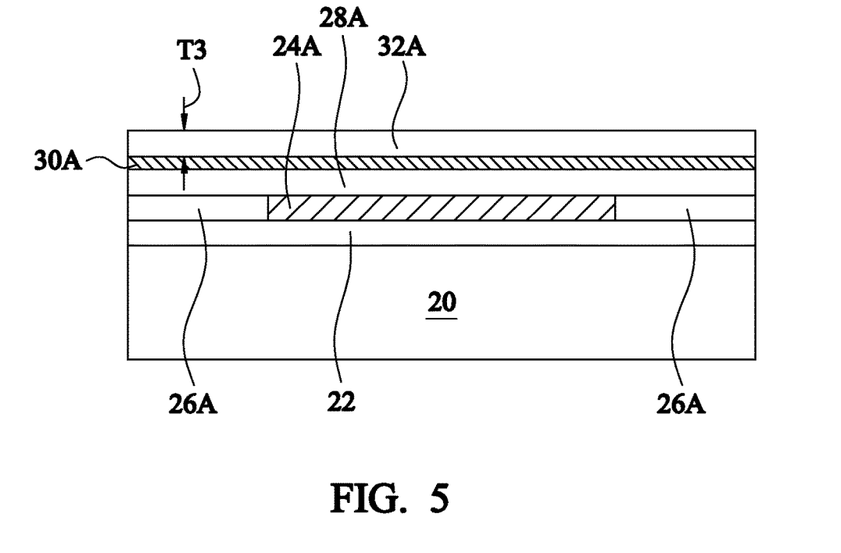
Figure 6:
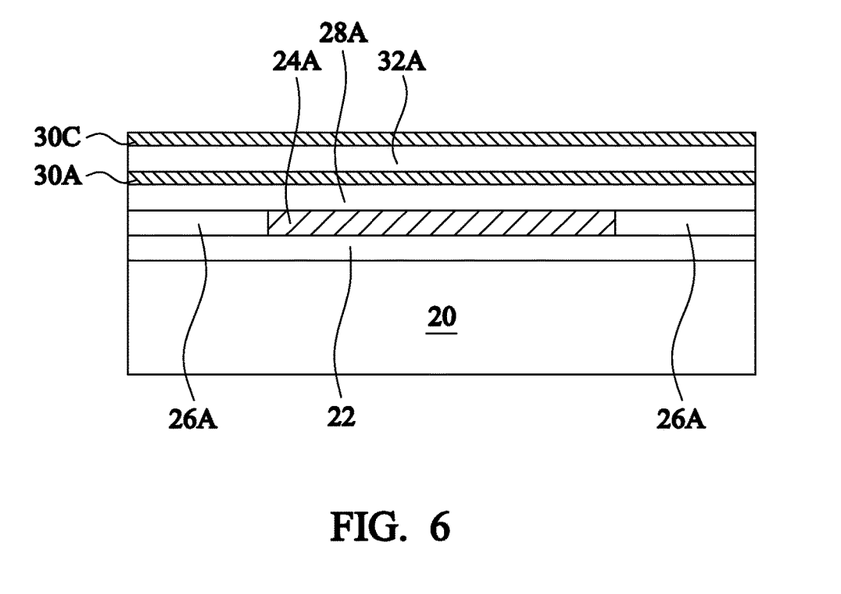

Next, as shown in FIG. 5, insulator 32A is formed over TMD layer 30A. The respective step is shown as step 208 in the process flow shown in FIG. 17. Insulator 32A is a dielectric layer having a low EOT. In accordance with some embodiments, insulator 32A is formed of a high-k dielectric material selected from $HfO_2$, $HfSiO_x$, $HfZrO_x$, $Al_2O_3$, $TiO_2$, $LaO_x$, $BaSrTiO_x$, $PbZr_xTi_yO_z$, or the like. The EOT of insulator 32A is desirably as small as possible in some exemplary embodiments, providing insulator 32A can provide effective insulation between TMD layer 30A and the overlying TMD layer 30C (FIG. 6). The reason for a low EOT is that the increase in the EOT of insulator 32A may result in the adverse increase in the sub-threshold swing of the resulting 2D TMD FET. For example, if the EOT is increased from about 0.5 nm to about 9.5 nm, the sub-threshold swing may increase from about 65 to about 69, as revealed by some experiment results. In accordance with some embodiments, the EOT of insulator 32A is smaller than about 2 nm, and may be smaller than about 1 nm. Thickness T3 of insulator 32A may be in the range between about 1 nm and about 15 nm.

Next, referring to FIG. 6, TMD layer 30C is formed. The respective step is shown as step 210 in the process flow shown in FIG. 17. In accordance with some embodiments of the present disclosure, TMD layer 30C is a single-mono-layer that includes only a single mono-layer 124 (FIG. 15). In alternative embodiments, TMD layer 30C has a few-layer structure includes several mono-layers 124, wherein the total count of the mono-layers 124 in TMD layer 30C may be lower than 5, for example, although a greater total count may be used. TMD layer 30C may be formed using a method selected from the same candidate methods for forming TMD layer 30A. For example, TMD layer 30C may be formed using CVD.

TMD layer 30C may include same elements as TMD layer 30A in accordance with some embodiments. For example, TMD layer 30A and TMD layer 30C may both be formed of MoSe$_2$. In alternative embodiments, TMD layer 30C includes elements that are different from the elements in TMD layer 30A. For example, TMD layer 30A may be formed of WSe$_2$, while TMD layer 30C may be formed of MoSe$_2$. The thickness of TMD layer 30C may be in the range between about 0.5 nm and about 5 nm in some exemplary embodiments.

Figure 7:
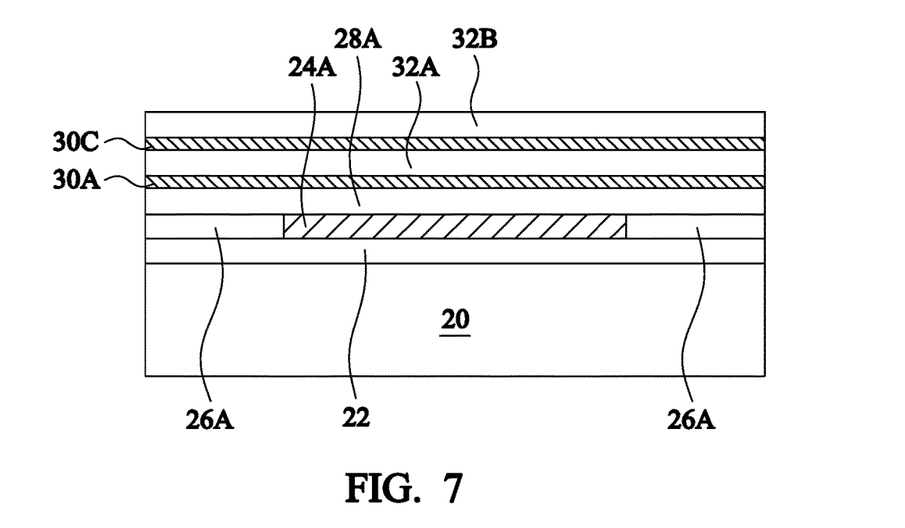
Figure 8:
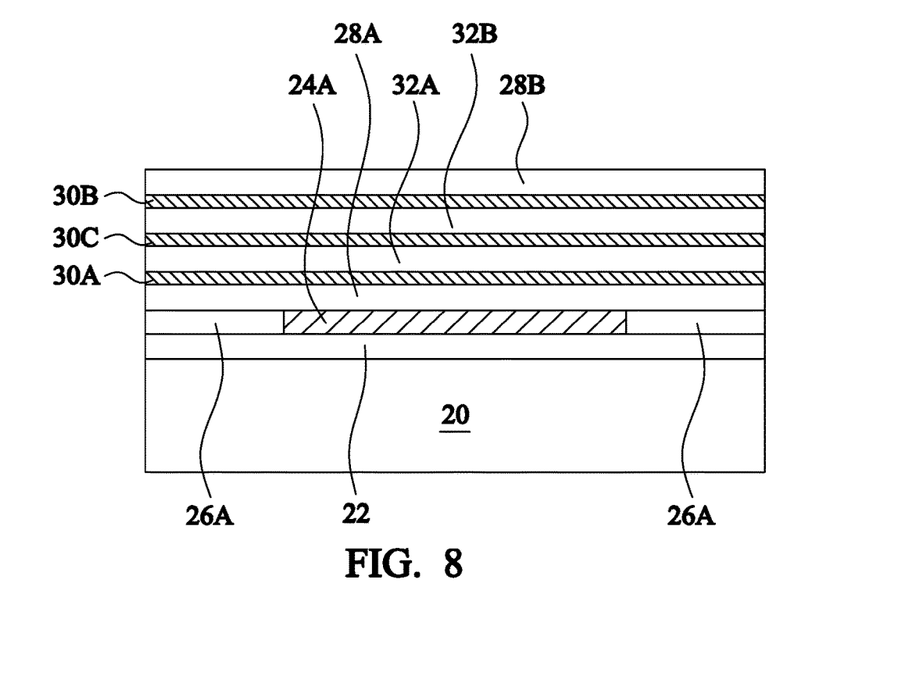

Next, referring to FIG. 7, insulator 32B is formed over TMD layer 30C. The respective step is shown as step 212 in the process flow shown in FIG. 17. Insulator 32B is also a dielectric layer having a low EOT. In accordance with some embodiments, insulator 32B is formed of a high-k dielectric material selected from HfO$_2$, HfSiO$_x$, HfZrO$_x$, Al$_2$O$_3$, TiO$_2$, LaO$_x$, BaSrTiO$_x$, PbZr$_x$Ti$_y$O$_z$, or the like. The EOT of insulator 32B may be as small as possible, providing it can provide effective insulation between TMD layer 30C and the overlying TMD layer 30B (FIG. 8). In accordance with some embodiments, the EOT of insulator 32B is smaller than about 2 nm, and may be smaller than about 1 nm.

FIG. 8 illustrates the formation of TMD layer 30B over insulator 32B, and gate dielectric 28B over TMD layer 30B. The respective steps are shown as steps 214 and 216 in the process flow shown in FIG. 17. In accordance with some embodiments of the present disclosure, TMD layer 30B is a single-mono-layer that includes only a single mono-layer 124 (FIG. 15). In alternative embodiments, TMD layer 30B has a few-layer structure includes several mono-layers 124, wherein the total count of the mono-layers 124 in TMD layer 30B may be lower than 5, for example, although a greater total count may be used. TMD layer 30B may be formed using a method selected from the same candidate methods for forming TMD layers 30A and 30C. For example, TMD layer 30B may be formed using CVD.

TMD layer 30B may include the same elements as either one or both of TMD layers 30A and 30C in accordance with some embodiments. In alternative embodiments, TMD layer 30C includes elements that are different from the elements in TMD layers 30A and/or 30C. The thickness of TMD layer 30B may be in the range between about 0.5 nm and about 5 nm in some exemplary embodiments. Gate dielectric 28B is similar to gate dielectric 28A, and hence its formation details and materials are not discussed in detail herein.

When the resulting 2D TMD FET 50 (FIGS. 14A and 14B) is a p-type FET device, TMD layers 30A, 30B, and 30C are doped as n-type by doping, for example, potassium (K), wherein the doping may be performed after the formation of each of TMD layers 30A, 30B, and 30C. When the resulting 2D TMD FET 50 (FIGS. 14A and 14B) is an n-type FET device, TMD layers 30A, 30B, and 30C may be doped as p-type by doping, for example, NO$_2$, wherein the doping may be performed after the formation of each of TMD layers 30A, 30B, and 30C.

Figure 9:
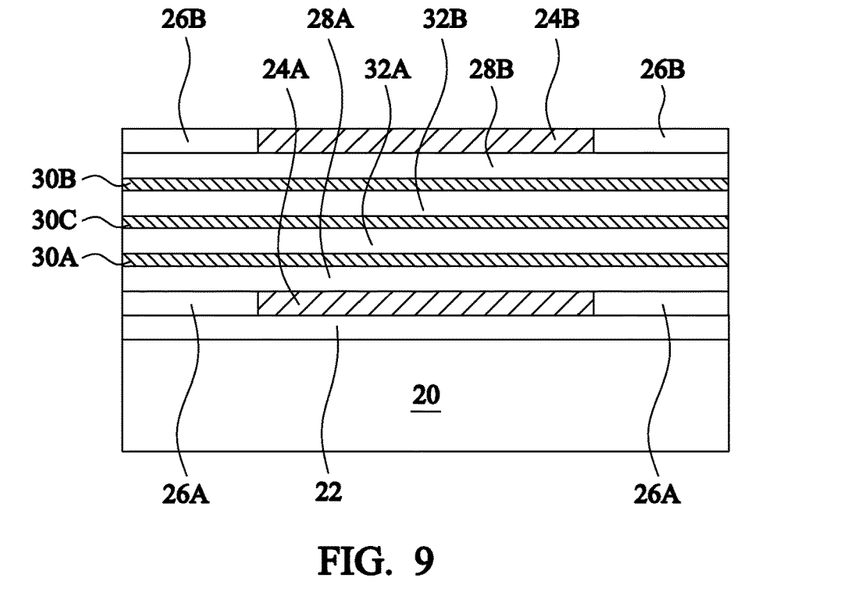

Next, referring to FIG. 9, conductive layer 24B (referred to as top gate 24B hereinafter) and dielectric layer 26B are formed. The respective step is shown as step 218 in the process flow shown in FIG. 17. The materials and the formation methods of top gate 24B and dielectric layer 26B are similar to that of bottom gate 24A and dielectric layer 26A, respectively. For example, top gate 24B may be a metal-containing layer including Ni, Pd, Sc, Ti, or other metals, or may be formed using other conductive materials such as polysilicon, metal silicide, metal nitride, or the like. The formation method includes PVD, ALD, or other applicable materials.

Dielectric layer 26B is formed on the opposite sides of top gate 24B. In accordance with some embodiments, when viewed in the top view, dielectric layer 26B fully encircles top gate 24B. Dielectric layer 26B may also be formed of a dielectric material such as a nitride, an oxynitride, a carbide, or the like. The top surface of dielectric layer 26B is coplanar with the top surface of top gate 24B in some embodiments.

Figure 10:
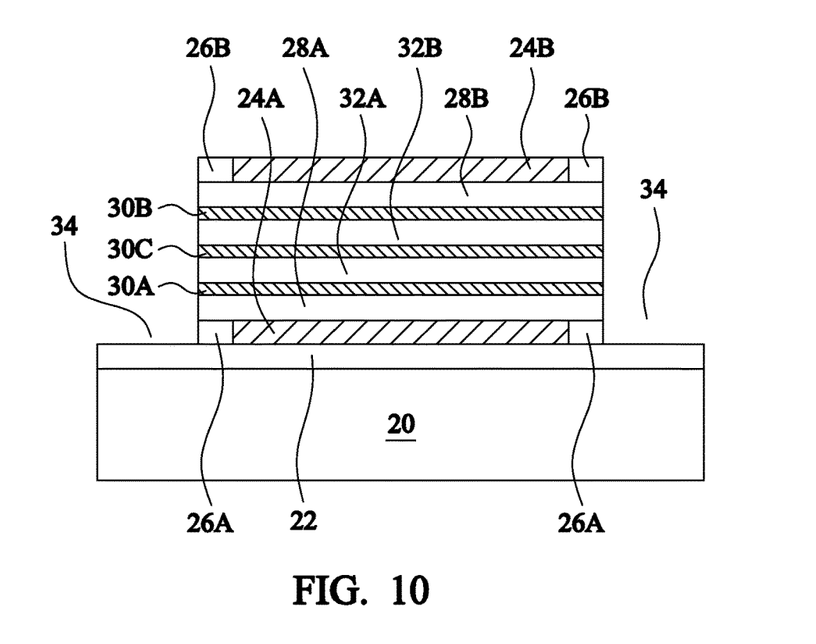

FIG. 10 illustrates the patterning of the stacked layers 26A, 28A, 30A, 32A, 30C, 32B, 30B, 28B, and 26B in accordance with some embodiments, so that openings 34 are formed on the opposite sides of the stacked structure. The respective step is shown as step 220 in the process flow shown in FIG. 17. TMD layers 30A, 30B, and 30C have opposite edges exposed to openings 34. The patterning may be performed until insulation layer 22 is exposed. Alternatively, the patterning may be stopped when dielectric layer 26A is exposed, but not etched through.

Figure 11:
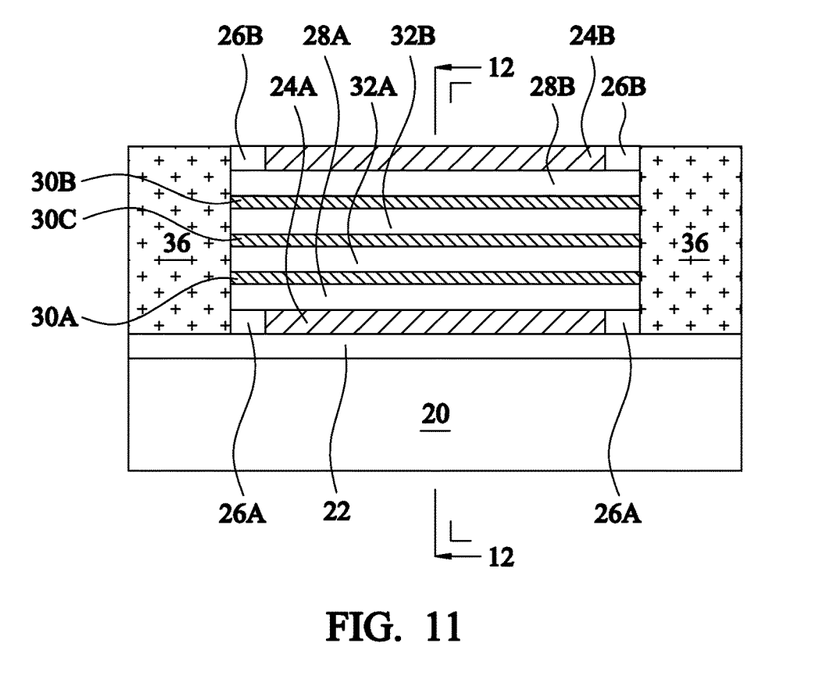

Referring to FIG. 11, source and drain regions (referred to as source/drain regions hereinafter) 36 are formed in openings 34 (FIG. 10). The respective step is also shown as step 220 in the process flow shown in FIG. 17. In accordance with some embodiments, source/drain regions 36 are formed of a conductive material selected from Pd, silver (Ag), Ni, gold (Au), Ti, gadolinium (Gd), or alloys thereof. The formation may include filling a respective conductive material into openings 34, and then performing a CMP to remove excess portions of the conductive material over top gate 24B and dielectric layer 26B.

Figure 12:
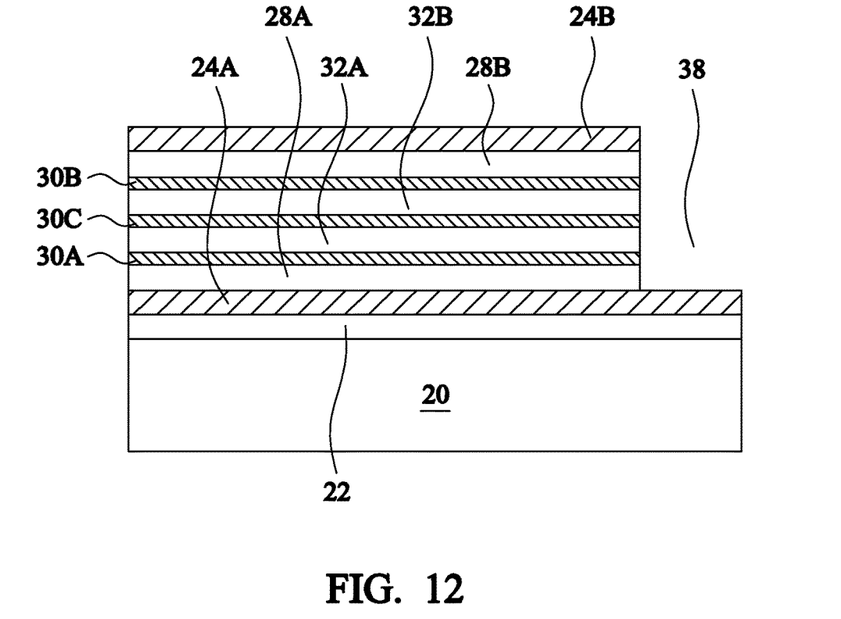

FIG. 12 illustrates the further patterning of the stack layers to expose bottom gate 24A. The respective step is shown as step 222 in the process flow shown in FIG. 17. The structure shown in FIG. 12 is obtained from the plane containing line 12-12 in FIG. 11. Accordingly, no source/drain regions are shown in the illustrated plane. In the patterning step, layers 28A, 30A, 32A, 30C, 32B, 30B, 28B, and 24B are etched, and bottom gate 24A is exposed through the resulting opening 38.

Figure 13A:
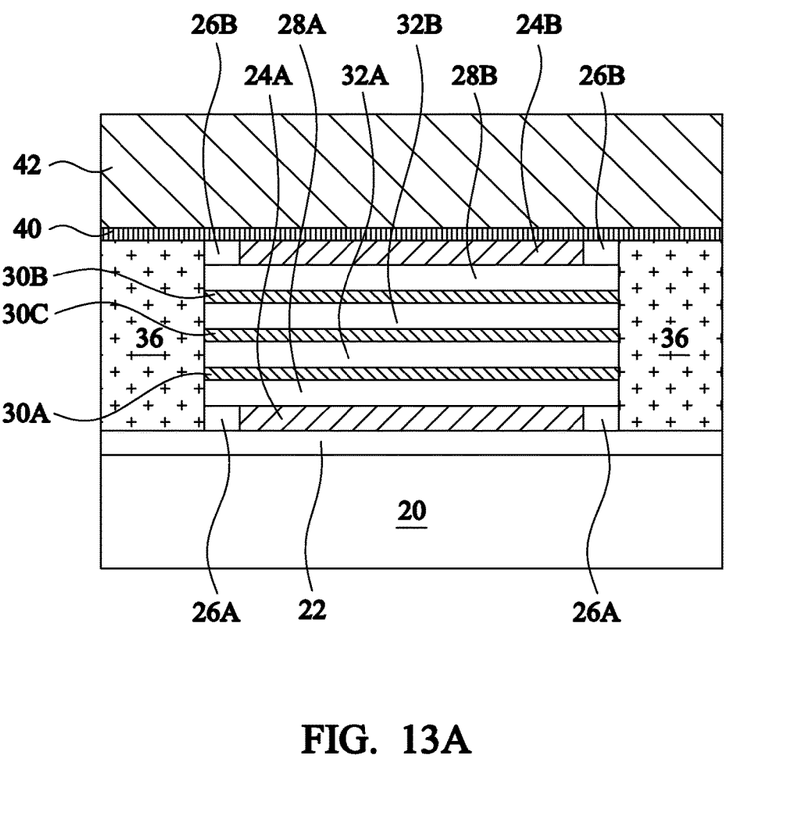
Figure 13B:
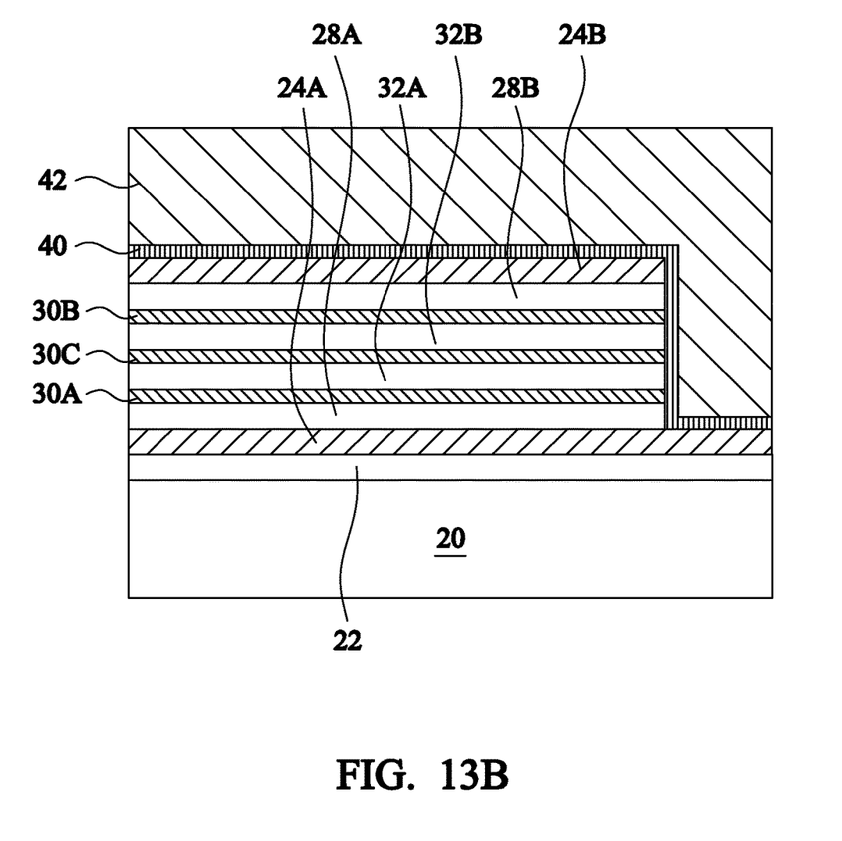

FIGS. 13A and 13B illustrate the formation of contact etch stop layer 40 and Inter-Layer Dielectric (ILD) 42 over contact etch stop layer 40. The respective step is shown as step 224 in the process flow shown in FIG. 17. FIG. 13A is obtained from the plane same as the plane of FIG. 11, and FIG. 13B is obtained from the plane same as the plane of FIG. 12. Contact etch stop layer 40 may comprise silicon carbide, silicon nitride, silicon oxynitride, silicon carbo-nitride, or multi-layers thereof. Furthermore, contact etch stop layer 40 is formed of a material that has a high etching selectivity relative to the overlying ILD 42, and hence contact etch stop layer 40 may be used to stop the etching of ILD 42. In accordance with some exemplary embodiments, ILD 42 comprises phosphosilicate glass (PSG), borosilicate glass (BSG), boron-doped phosphosilicate glass (BPSG), fluorine-doped silicate glass (FSG), tetraethyl orthosilicate (TEOS), or the like. ILD 42 may be formed using spin coating, Flowable Chemical Vapor Deposition (FCVD), or the like. In alternative embodiments of the present disclosure, ILD 42 is formed using a deposition method such as PECVD, Low Pressure Chemical Vapor Deposition (LP-CVD), or the like.

As shown in FIG. 13A, contact etch stop layer 40 is formed over and contacting top gate 24B and dielectric layer 26B. As also shown in FIG. 13B, contact etch stop layer 40 also extends into opening 38 (FIG. 12), and extends on the sidewalls of the stacked layers 28A, 30A, 32A, 30C, 32B, 30B, 28B, and 24B. Furthermore, contact etch stop layer 40 may extend on and contacting the top surface of bottom gate 24A in some embodiments.

Figure 14A:
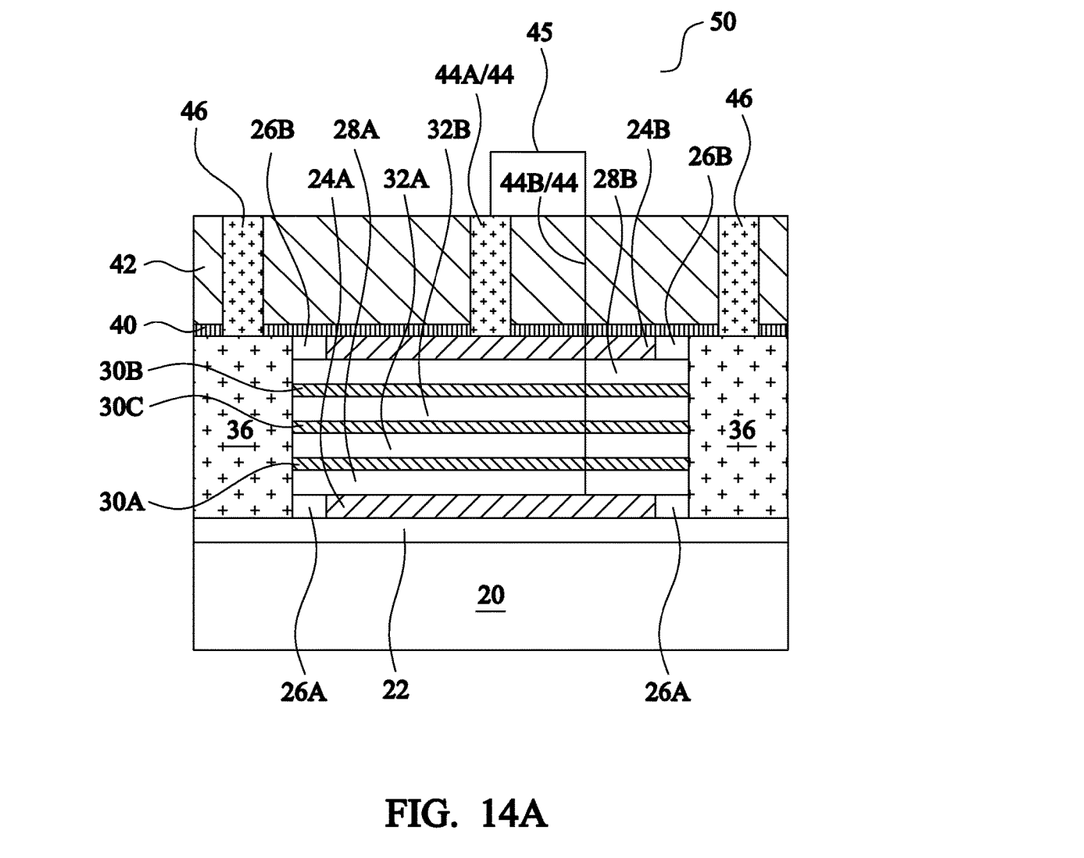
Figure 14B:
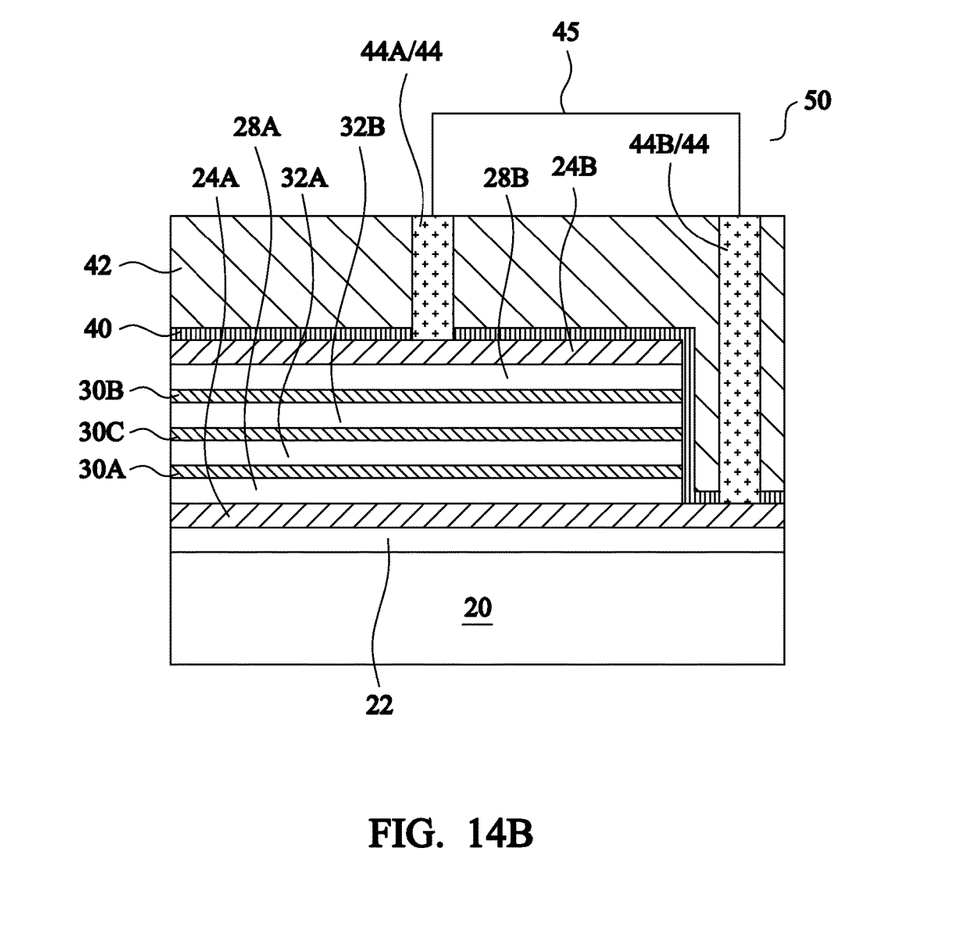

FIGS. 14A and 14B illustrate the formation of gate contact plugs 44 (including 44A and 44B) and source/drain contact plugs 46. The respective step is shown as step 226 in the process flow shown in FIG. 17. FIG. 14A is obtained from the plane same as the plane of FIG. 13A, and FIG. 14B is obtained from the plane same as the plane of FIG. 13B. In accordance with some embodiments of the present disclosure, contact plugs 44 and 46 are formed of a conductive material selected from tungsten, aluminum, copper, titanium, tantalum, titanium nitride, tantalum nitride, alloys therefore, and/or multi-layers thereof. The formation of contact plugs 44 and 46 may include etching ILD 42 and contact etch stop layer 40 to form openings, filling the conductive material(s) into the contact openings until the conductive material fills the entireties of the contact openings, and performing a planarization (such as CMP) to level the top surfaces of contact plugs 44 and 46 with the top surface of ILD 42. As shown in FIG. 14A, source/drain contact plugs 46 are electrically connected to source/drain regions 36. As shown in FIGS. 14A and 14B, gate contact plugs 44A and 44B are electrically connected to top gate 24B and bottom gate 24A, respectively. In subsequent steps, electrical connections 45 such as metal lines and vias are formed to electrically interconnect gate contact plugs 44A and 44B. Accordingly, top gate 24B and bottom gate 24A are electrically shorted, and may be provided with the same gate voltage. The formation of 2D TMD FET 50 is thus finished.

As shown in FIG. 14A, 2D TMD FET 50 has TMD layers 30A, 30B, and 30C as the channels, wherein each of TMD layers 30A, 30B, and 30C is connected between the source and drain regions 36, and TMD layers 30A, 30B, and 30C are turned on or off at the same time by top gate 24B and bottom gate 24A. TMD layer 30B is mainly controlled by top gate 24B, although it is also controlled by bottom gate 24A. TMD layer 30A is mainly controlled by bottom gate 24A, although it is also controlled by top gate 24B. TMD layer 30C is controlled by both top gate 24B and bottom gate 24A.

Figure 16:
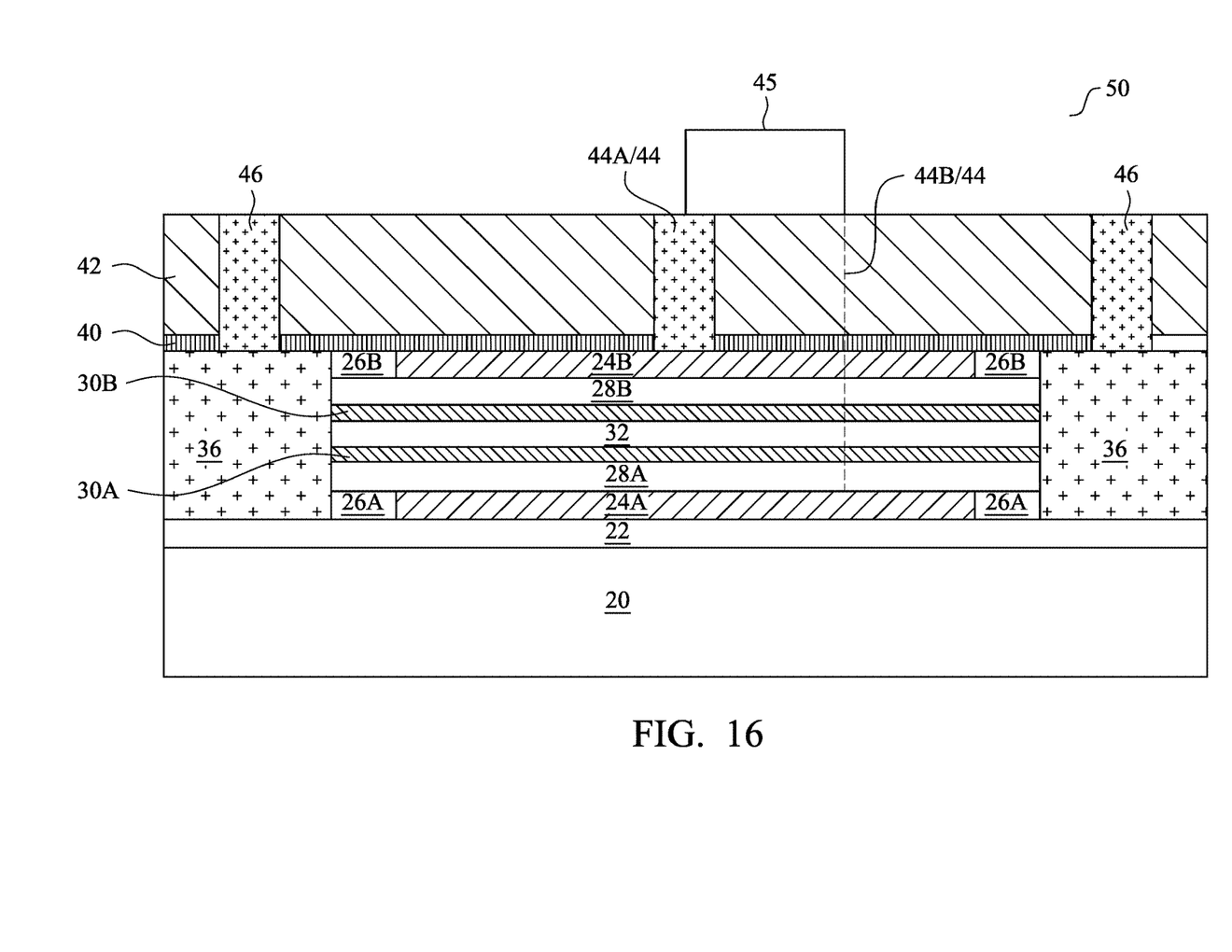
FIG. 16 illustrates a cross-sectional view of a 2D TMD FET in accordance with alternative embodiments.

FIG. 16 illustrates the 2D TMD FET 50 in accordance with alternative embodiments. The materials and the formation methods of the components in these embodiments are essentially the same as the like components, which are denoted by like reference numerals in the embodiments shown in FIGS. 1 through 14B. In these embodiments, TMD layer 32C as in FIG. 14A is not formed, and insulator 32, which is essentially the same as either one of insulator 32A and 32B in FIGS. 14A and 14B, is formed. The details regarding the formation process and the materials of the components shown in FIG. 16 may thus be found in the discussion of the embodiments shown in FIGS. 1 through 14B.

2D TMD FET 50 in FIG. 16 has TMD layers 30A and 30B as the channels, wherein each of TMD layers 30A and 30B is connected between source and drain regions 36, and TMD layers 30A and 30B are turned on or off at the same time by top gate 24B and bottom gate 24A. TMD layer 30B is mainly controlled by top gate 24B, although it is also controlled by bottom gate 24A. TMD layer 30A is mainly controlled by bottom gate 24A, although it is also controlled by top gate 24B.

The embodiments of the present disclosure have some advantageous features. Experiment results indicated that when three layers of TMD layers (such as 30A, 30B, and 30C in FIG. 14A) are formed in a sample 2D TMD FET, the drive current is 2.7 times the drive current of a 2D TMD FET with a single TMD layer. The sub-threshold swing of the 2D TMD FET is about 65.1, which is a light increase over the sub-threshold swing 60.6 of the 2D TMD FET with a single TMD layer. When five layers of TMD layers are formed in a sample 2D TMD FET, the drive current is 4.5 times the drive current of the 2D TMD FET with a single TMD layer. The sub-threshold swing is only increased to about 72.2. Accordingly, by increasing the number of TMD layers (which are separated by insulators), the drive current of the resulting 2D TMD FET may be significantly increased without causing too much increase in sub-threshold swing. The on/off current ratio of the 2D TMD FET with a plurality of TMD layers separated by insulators is also increased over the on/off current ratio of the 2D TMD FET with a thick TMD layer due to the improved control of the channel by the gate, which causes the effective mass of the mono-layers to decrease. The leakage current (off current) of the 2D TMD FET in accordance with embodiments is also reduced.

In accordance with some embodiments of the present disclosure, a device includes device includes a semiconductor substrate, a buried oxide over the substrate, a first transition metal dichalcogenide layer over the buried oxide, an insulator over the first transition metal dichalcogenide layer, and a second transition metal dichalcogenide layer over the insulator. A gate dielectric is over the second transition metal dichalcogenide layer, and a gate is over the gate dielectric.

In accordance with alternative embodiments of the present disclosure, a device includes a bottom gate, a first gate dielectric overlapping the bottom gate, a first transition metal dichalcogenide layer overlapping the first gate dielectric, a first insulator overlapping the first transition metal dichalcogenide layer, a second transition metal dichalcogenide layer overlapping the first insulator, a second gate dielectric overlapping the second transition metal dichalcogenide layer, and a top gate overlapping the second gate dielectric. The bottom gate and the top gate are electrically interconnected, and a source region and a drain region on opposite sides of the first and the second transition metal dichalcogenide layers.

In accordance with yet alternative embodiments of the present disclosure, a method includes forming a bottom gate over an insulation layer, forming a first dielectric layer on opposite sides of the bottom gate, forming a first gate dielectric overlapping the bottom gate, forming a first transition metal dichalcogenide layer overlapping the first gate dielectric, forming a first insulator overlapping the first transition metal dichalcogenide layer, forming a second transition metal dichalcogenide layer overlapping the first insulator, forming a second gate dielectric overlapping the second transition metal dichalcogenide layer, and forming a top gate overlapping the second gate dielectric. The bottom gate and the top gate are electrically interconnected. The method further includes forming a second dielectric layer on opposite sides of the top gate, patterning the second dielectric layer, the second transition metal dichalcogenide layer, the first insulator, and the first transition metal dichalcogenide layer to form source/drain openings. The source/drain openings are filled to form a source region and a drain region on opposite sides of the first and the second transition metal dichalcogenide layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a semiconductor substrate;
a buried oxide over the semiconductor substrate;
a stack of layers comprising:
   a first transition metal dichalcogenide layer over the buried oxide;
   a first insulator over the first transition metal dichalcogenide layer;
   a second transition metal dichalcogenide layer over the first insulator;
   a second insulator overlapped by the first transition metal dichalcogenide layer;
   a third transition metal dichalcogenide layer overlapped by the second insulator;
a first gate dielectric over the second transition metal dichalcogenide layer, wherein edges of the stack of layers and the first gate dielectric are flush with each other; and
a first gate over the first gate dielectric.

2. The device of claim 1 further comprising:
a second gate dielectric overlapped by the first transition metal dichalcogenide layer, wherein an edge of the second gate dielectric is flushed with the edges of the stack of layers and the first gate dielectric; and
a second gate overlapped by the second gate dielectric, wherein the first gate and the second gate are electrically interconnected.

3. The device of claim 1 further comprising a source region and a drain region on opposite sides of and interconnected by the first and the second transition metal dichalcogenide layers.

4. The device of claim 1, wherein one of the first transition metal dichalcogenide layer and the second transition metal dichalcogenide layer has a single-mono-layer structure.

5. The device of claim 1, wherein the first transition metal dichalcogenide layer and the second transition metal dichalcogenide layer comprise a same transition metal and a same group VIA element.

6. The device of claim 1, wherein the first transition metal dichalcogenide layer and the second transition metal dichalcogenide layer comprise different elements.

7. The device of claim 1, wherein the first transition metal dichalcogenide layer, the first insulator, the second transition metal dichalcogenide layer, the second insulator, and the third transition metal dichalcogenide layer have edges flush with each other.

8. The device of claim 7, wherein the first gate dielectric further comprises edges flush with respective edges of the first transition metal dichalcogenide layer, the first insulator, the second transition metal dichalcogenide layer, the second insulator, and the third transition metal dichalcogenide layer.

9. A device comprising:
a bottom gate;
a first gate dielectric overlapping the bottom gate;
a first transition metal dichalcogenide layer overlapping the first gate dielectric;
a first insulator overlapping the first transition metal dichalcogenide layer;
a second transition metal dichalcogenide layer overlapping the first insulator;
a second gate dielectric overlapping the second transition metal dichalcogenide layer;
a top gate overlapping the second gate dielectric, wherein the bottom gate and the top gate are electrically interconnected; and
a source region and a drain region on opposite sides of the first and the second transition metal dichalcogenide layers, wherein one of the source region and the drain region has a vertical and straight edge in contact with edges of the first gate dielectric, the first transition metal dichalcogenide layer, the first insulator, the second transition metal dichalcogenide layer, and the second gate dielectric.

10. The device of claim 9 further comprising a dielectric layer at a same level as the bottom gate, wherein the dielectric layer comprises a first portion and a second portion on opposite sides of, and in contact with, the bottom gate, and the vertical and straight edge of the one of the source region and the drain region is further in contact with an edge of the first portion of the dielectric layer.

11. The device of claim 9 further comprising:
a second insulator overlapping the second transition metal dichalcogenide layer; and
a third transition metal dichalcogenide layer overlapping the second insulator, wherein the third transition metal dichalcogenide layer is overlapped by the second gate dielectric.

12. The device of claim 9, wherein each of the first transition metal dichalcogenide layer and the second transition metal dichalcogenide layer has fewer than about 5 mono-layers.

13. The device of claim 9, wherein the first insulator has an effective oxide thickness smaller than about 1 nm.

14. The device of claim 9, wherein each of the first gate dielectric and the second gate dielectric has an effective oxide thickness smaller than about 2 nm.

15. The device of claim 9, wherein the first transition metal dichalcogenide layer and the second transition metal dichalcogenide layer have a same conductivity type.

16. A device comprising:
a stack comprising:
   a plurality of transition metal dichalcogenide layers; and
   a plurality of insulators separating the plurality of transition metal dichalcogenide layers from each other;
a first gate dielectric over the stack, wherein an edge of the first gate dielectric is flush with edges of the plurality of transition metal dichalcogenide layers and the plurality of insulators; and
a first gate over the first gate dielectric.

17. The device of claim 16 further comprising:
a semiconductor substrate; and
a buried dielectric over the semiconductor substrate, wherein the stack is over the buried dielectric.

18. The device of claim 16 further comprising:
a second gate dielectric overlapped by the stack; and
a second gate overlapped by the second gate dielectric, wherein the first gate and the second gate are electrically interconnected.

19. The device of claim 16 further comprising a source region and a drain region on opposite sides of, and interconnected by, the plurality of transition metal dichalcogenide layers.

20. The device of claim 16, wherein a top layer of the plurality of transition metal dichalcogenide layers is in contact with the first gate dielectric.

* * * * *